United States Patent [19]

Huber

[11] Patent Number: 5,059,911
[45] Date of Patent: Oct. 22, 1991

[54] CABLE FAULT LOCATION DETECTOR

[75] Inventor: Carl H. Huber, Columbia, Md.

[73] Assignee: The United States of America as represented by the Secretary of the Navy, Washington, D.C.

[21] Appl. No.: 602,599

[22] Filed: Oct. 24, 1990

[51] Int. Cl.$^5$ .............................................. G01R 31/08
[52] U.S. Cl. .................................... 324/539; 324/523; 324/532
[58] Field of Search ............... 324/522, 523, 527, 532, 324/535, 539, 519, 677, 678

[56] References Cited

U.S. PATENT DOCUMENTS

| | | | |
|---|---|---|---|
| 3,777,217 | 12/1973 | Groce et al. | 324/539 X |
| 4,160,947 | 7/1979 | Tanno et al. | 324/539 |
| 4,839,598 | 6/1989 | Calvert et al. | 324/539 |

Primary Examiner—Kenneth A. Wieder
Assistant Examiner—Glenn W. Brown
Attorney, Agent, or Firm—Robert M. Wohlfarth; John P. Tarlano

[57] ABSTRACT

Apparatus and method for detecting a location of a break in a conductor of a cable, the cable having a multiple number of conductors. The conductors that are not under investigation are connected to ground potential. The conductor that is under investigation is connected to a timer, a resistor, and a DC voltage source that in turn is connected to ground potential. Charging current flows into the conductor under investigation. The time that it takes for the current to decrease to (1/e) of the current's initial value is measured by the timer. Alternately, the conductor that is under investigation is connected to a resistor and a DC voltage source that in turn is connected to ground potential. This conductor is also connected to a voltage level timer that is connected to ground potential. The charging voltage of the conductor increases. The time that it takes for the charging voltage to increase to $(1-1/e)$ of the voltage value of the DC voltage source, is measured by the timer. The length of a measured time is indicative of the distance of a break from the DC voltage source.

8 Claims, 5 Drawing Sheets

CABLE FAULT LOCATION DETECTOR

FIELD OF THE INVENTION

The present invention relates to a method of detecting a location of a break in a conductor of an electrical cable that has a multiple number of conductors therein, by means of a timer.

BACKGROUND OF THE INVENTION

In the past it has been difficult to determine the location of a break in a conductor that is located within a cable that has a multiple number of conductors therein. One such means of detecting the location for such a break was by visual inspection. However such a method is not reliable when the break or discontinuity is hidden from view.

A probe that can detect an open, a break or an unused pin in a multiconductor cable is known in the art. The probe operates based on the amount of capacitance between the conductor and the cable. However, the probe cannot precisely determine the location of a break in a conductor of the cable since the probe does not have a timing means.

The present invention is an improvement in the art of detecting the location of a break in a conductor of a multiconductor cable. In the present invention the amount of capacitance between the conductor under investigation and adjacent conductors, is determined by means of a timer. The smaller the capacitance is, between the broken conductor and adjacent conductors, the closer the break is to the automatic cable tester.

In the invention the method measures the charging rate of the capacitance between the conductor under investigation with respect to the other conductors of the cable which are held at ground potential. The charging rate of the capacitance is the result of a charging current into the conductor under test.

A capacitance exists between adjacent conductors of such a cable. The capacitance charging rate between the conductor under investigation and adjacent conductors will depend upon the length of unbroken portion of the conductor under investigation. The longer the unbroken portion of the conductor is from the point of contact with an automatic cable tester, the slower is the charge rate to reach a full charge potential. If the break is near the point of contact with the automatic cable tester, the charge rate is relatively large, whereas if the break is more distance from the point of contact of the automatic cable tester, the charge rate is relatively small.

The time that it takes for the charging current to decrease to a value, such as 1/e of its initial value, is measured in order to detect the location of a break. Alternatively, the time that it takes for the charging voltage buildup to increase to a value, such as $(1-1/e)$ of the value of the applied voltage, can be measured in order to detect the location of a break.

DESCRIPTION OF THE PREFERRED EMBODIMENT

Figure 1:
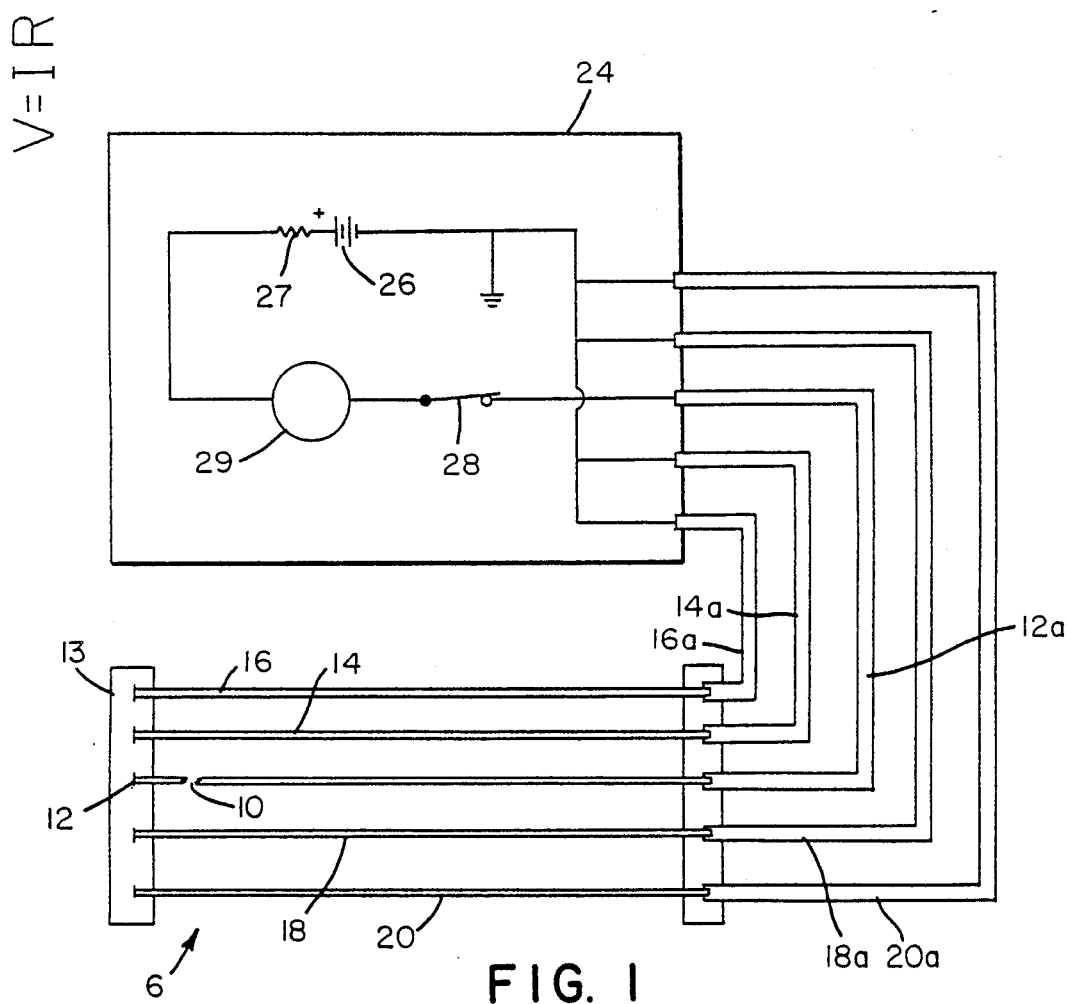
FIG. 1 is a schematic diagram of a test setup for detecting the location of a break in a conductor that is distant from an automatic cable tester.

FIG. 1 shows a test setup 6 for determining the location for a break 10 in a conductor 12 in a multiconductor cable 13. Other conductors 14, 16, 18 and 20 of cable 13 are shown. An electrical connection is made to one end of each of the conductors 12, 14, 16, 18 and 20 by means of leads 12a, 14a, 16a, 18a, and 20a. The opposite end of each lead 12a, 14a, 16a, 18a and 20a is connected to a ground potential within automatic cable tester 24.

Within the tester 24 is a DC voltage source 26, resistor 27 and switch 28. One side of the voltage source 26, opposite to switch 28, is connected to ground potential. Between the voltage source 26 and the switch 28 is a device that will detect the time during which charging current, having a level above a chosen level IT, flows. Such a device could be a current timer 29.

The leads 14a, 16a, 18a and 20a are connected to the test device 24. Within the test device 24 is a common ground. These leads 14a, 16a, 18a and 20 are connected to this common ground. The lead 12a, and thus the conductor 12 is connected to the switch 28.

Figure 2:
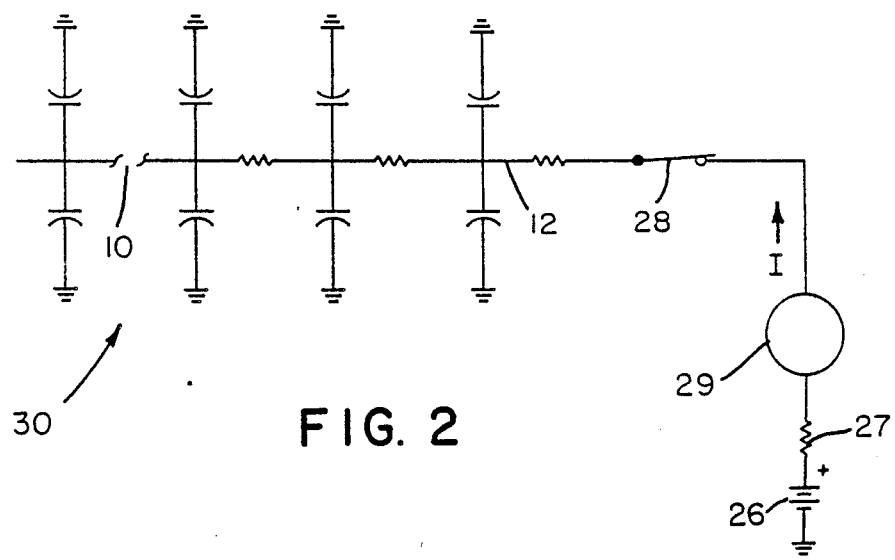
FIG. 2 is a circuit diagram of an electrical circuit for measuring charging current with respect to time into the conductor, for the test setup of FIG. 1.

As shown in FIG. 2 when switch 28 is closed, the equivalent circuit 30 begins to charge. Since the circuit 30 has four sets of parallel capacitors, charging current flows through the timer 29 for a relatively long period of time, as compared to a flow time for a shorter conductor.

Figure 3:
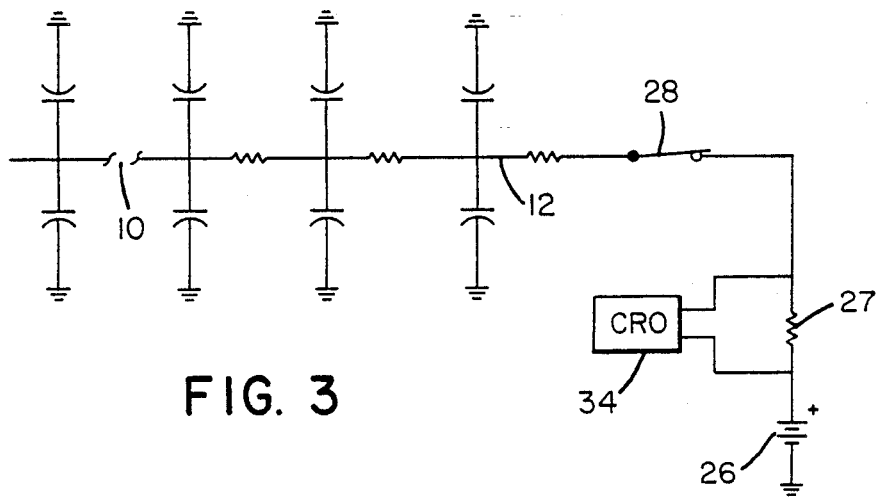
FIG. 3 is another circuit diagram of an electrical circuit for measuring charging current with respect to time into the conductor for the test setup of FIG. 1.

As shown in FIG. 3, in place of timer 29 one could use an oscilloscope 34 connected across resistance R of resistor 27 in order to determine the amount of charging current through the resistor. The oscilloscope 34 could be a recording oscilloscope.

Figure 4:
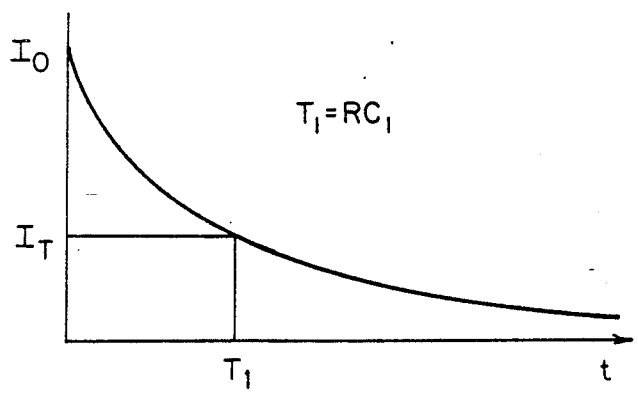
FIG. 4 is a trace of the charging current with respect to time into the conductor of FIG. 1.

The current flow I versus time t is shown in FIG. 4. The timer 29 will operate during a time T1 while the charging current is flowing at a level above a value IT. The timer 29 will measure time T1 shown in FIG. 4. The charging current flows through timer 29 is shown in FIG. 4. The charging current is initially IO, which equals the voltage VDC of the voltage source 26 divided by the resistance R of the testor's resistor R. C1 is the capacitance between conductor 12 and the adjacent conductors 14, 16, 18 and 20 of cable 13. The RC times constant T1 of conductor 12 equals R times C1. As shown in FIG. 4 the RC time constant for conductor 12 is relatively long, since FIG. 2 has four sets of capacitors therein. T1 is equal to R times C1, as shown in FIG. 4, where R is a series resistor and C1 is the parallel capacitance of the circuit shown in FIG. 2. By determining time T1 one can determine the location of break 10 in conductor 12. The function for the charging current I with respect to time is $$I = (Io)(e - t/RC1)$$

After the time T1 is found, length L1 of conductor 12 can be determined, since $T1 = R*C1 = (R)(K1*L1)$. K1 is the capacitance per unit length of the conductor 12 with respect to conductors 14, 16, 18 and 20. It is noted that $C1 = K1*L1$.

Figure 5:
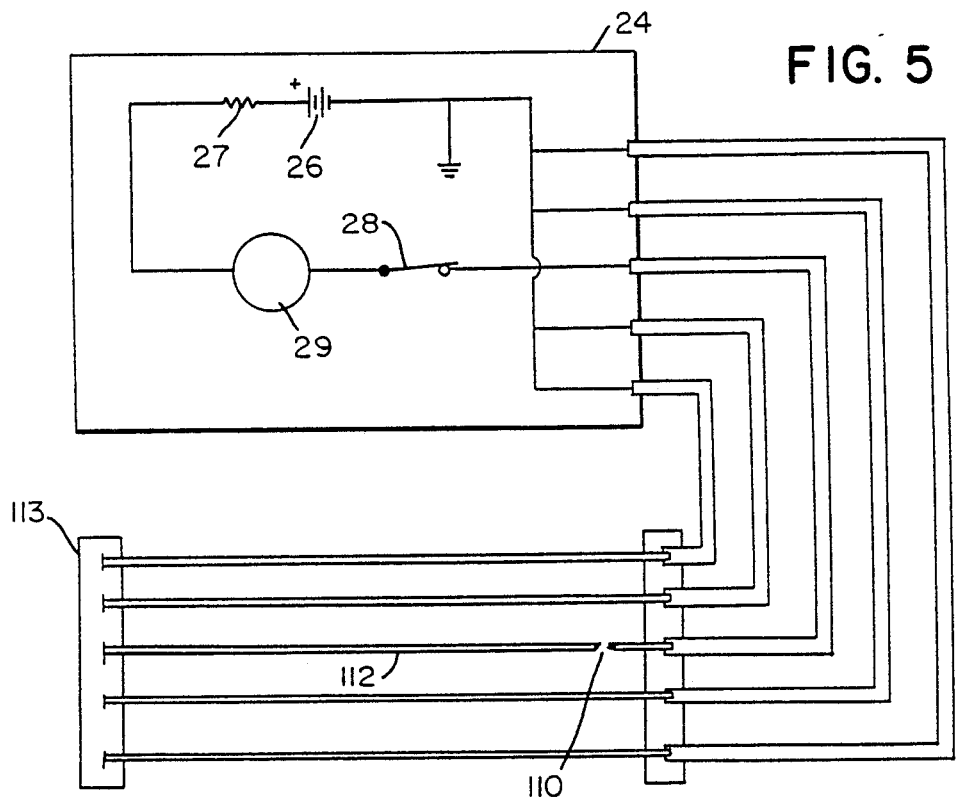
FIG. 5 is a schematic diagram of a test setup for detecting the location of a break in a conductor that is close to an automatic cable tester.

FIG. 5 shows a test set up similar to the test set up of FIG. 1. In FIG. 5 the conductor 112 has a break 110 in its right side, whereas the conductor 12 of FIG. 1 has a break 10 in its left side. Thus the conductor 12 of FIG. 1 is much longer, continuously, than the conductor 112 of FIG. 5. Otherwise the two diagrams of FIG. 1 and FIG. 5 are the same.

Since conductor 12 is longer than conductor 112, the capacitance between conductor 12 and its adjacent conductors is much more than the capacitance between conductor 112 and its adjacent conductors. Therefore the RC time constant of the cable 113 of FIG. 5 is less than the RC time constant of cable 13 of FIG. 1.

Figure 6:
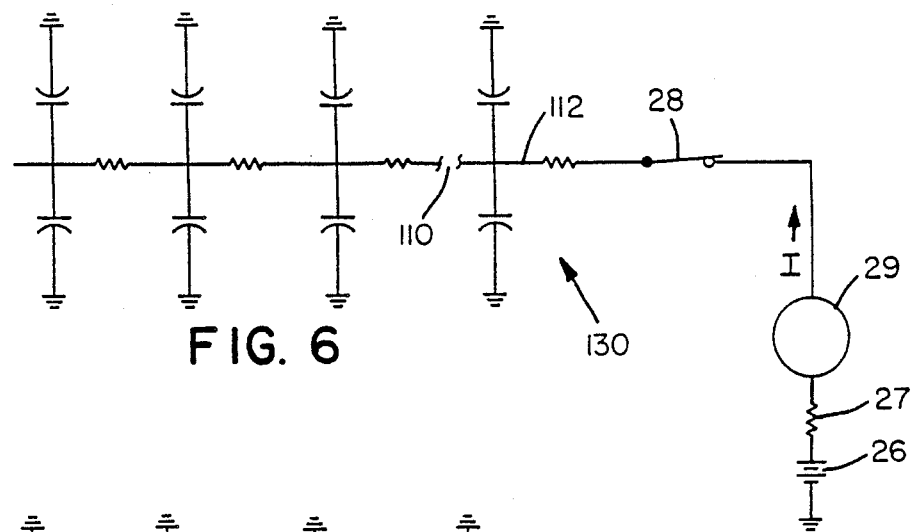
FIG. 6 is a circuit diagram of an electrical circuit for measuring charging current with respect to time into the conductor for the test setup of FIG. 5.

FIG. 6 shows a circuit 130 for the test setup of FIG. 5. It is noted that only one set of capacitors is shown in FIG. 6. Again the RC time constant T2 of the circuit 130 of FIG. 6 is less than the RC time constant T1 of the circuit 30 of FIG. 2, since there is much less capacitance in the circuit 130 of FIG. 6 than there is in the circuit 30 of FIG. 2. The tester portions of FIG. 6 are the same as those of FIG. 2.

Figure 7:
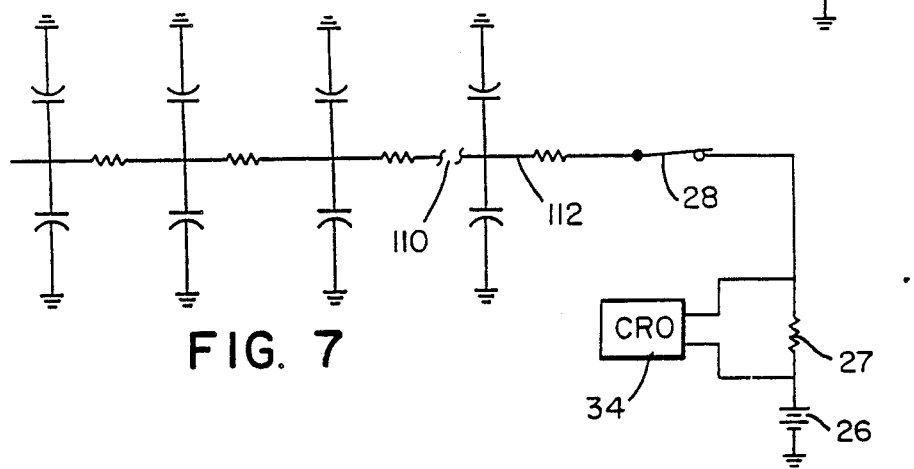
FIG. 7 is another circuit diagram of an electrical circuit for measuring charging current with respect to time into the conductor for the test setup of FIG. 5.

FIG. 7 shows the use of a standard resistor 32 and CRO 34 to detect charging current flow into the circuit 130 of FIG. 6.

Figure 8:
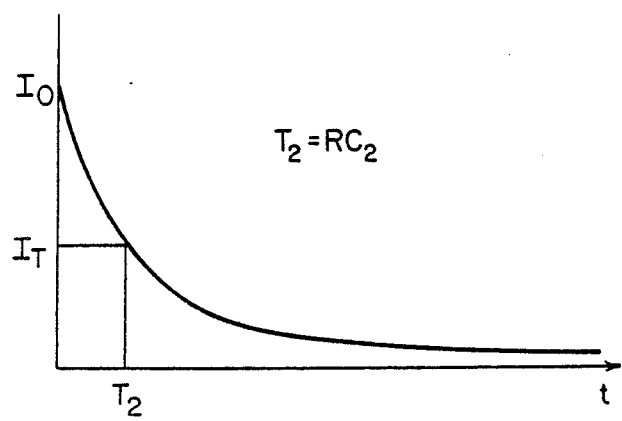
FIG. 8 is a trace of the charging current with respect to time into the conductor of FIG. 5.

FIG. 8 shows the flow of charging current I with respect to time t into the cable 113, in the set up of FIG. 5. The cable 113 has less capacitance than the cable 13 of FIG. 1. FIG. 8 shows that the RC timer constant RC2 of cable 113 is less than the RC time constant RC1 of cable 13, as shown in FIG. 4. The RC time constant RC2 is the time T2 during which charging current I drops from Io' to Io'/e in value. I0' is the initial current and equals the applied voltage VDC of the voltage source 26 divided be the resistance R. In the circuits of FIGS. 1 and 5 the two VDC values are equal. Also, the two R values are equal. Therefore Io' equals Io given above. e is the base value used in the natural log system. e equals 2.71828 to five significant figures. R is the resistance of resistor 27. C2 is the capacitance between conductor 112 and adjacent conductors in cable 113. By measuring the time T2 that it takes to equal the RC time constant RC2, with the timer 29 of FIG. 6 or the CRO 34 of FIG. 7, one can determine the length of the conductor 112, and thus the location of break 110 in conductor 112.

After the time T2 is found, length L2 of conductor 112 can be determined, since $T2 = R*C2 = (R)(K1*L2)$. K1 is the capacitance per unit length of the conductor 112 with respect to conductors 114, 116, 118 and 120. It is noted that $C2 = K1*L2$.

Figure 9:
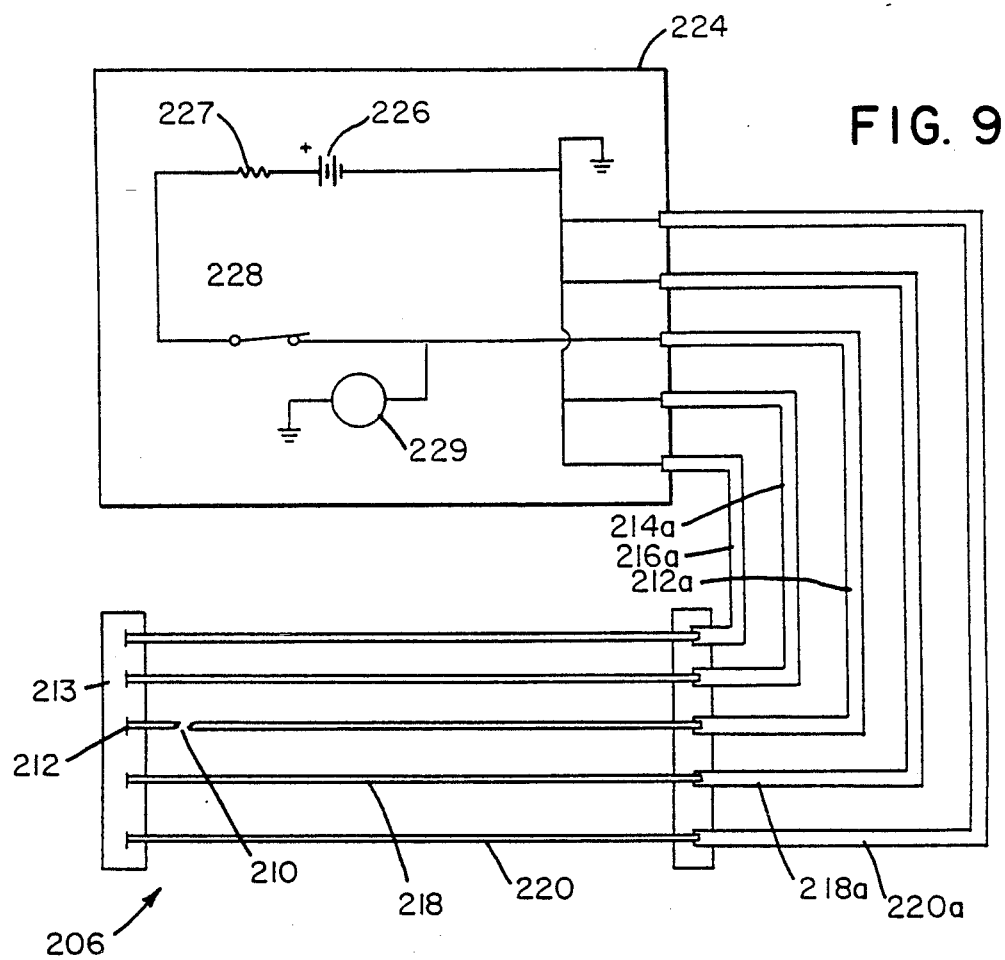
FIG. 9 is a schematic diagram of another test setup for detecting the location of a break in a conductor that is distant from an automatic cable tester.

FIG. 9 shows a test setup 206 for determining the location for a break 210 in a conductor 212 in a cable 213. Other conductors 214, 216, 218 and 220 of cable 213 are shown. An electrical connection is made to one end of each of the conductors 212, 214, 216, 218 and 220 by means of leads 212a, 214a, 216a, 218a, and 220a. The opposite end of each lead 212a, 214a, 216a, 218a and 220a is connected to a ground potential within automatic cable tester 224.

Within the tester 224 is a DC voltage supply 226, resistor 227, and a switch 228. One side of the power supply, opposite to switch 28, is connected to ground potential. Connected in parallel circuit with switch 228 is voltage measuring device 229. The voltage measuring device 229 is connected to the side of switch 228 that is opposite to power supply 226. The other side of the voltage measuring device 229 is connected to ground. The device 229 will detect a time charging voltage buildup V, due to a charging current I. Such a voltage measuring device 229 could be a voltage timer. The timer could operate until a voltage value, such as voltage value of VT, is reached.

The leads 214a, 216a, 218a and 220a are connected to the test device 224. Within the test device 224 is a common ground. These leads 214a, 216a, 218a and 220a are connected to this common ground. The lead 212a, and thus the conductor 212, is connected to the switch 228.

Figure 10:
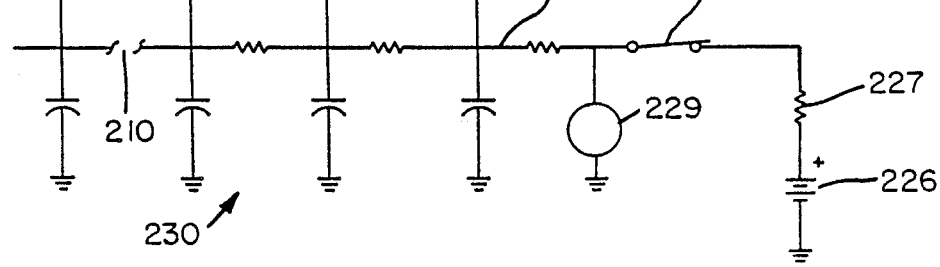
FIG. 10 is a circuit diagram of an electrical circuit for measuring charging voltage buildup with respect to time in the conductor, for the test setup of FIG. 9.

As shown in FIG. 10 when switch 228 is closed, the equivalent circuit 230 begins to charge. Since the circuit 230 has four sets of parallel capacitors, charging current for a relatively long period of time, as compared to a flow time for a shorter conductor. The voltage measuring device the amount of voltage buildup on conductor 212.

Figure 11:
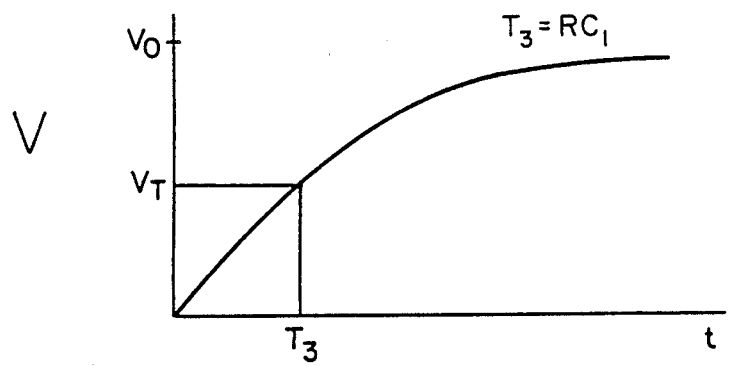
FIG. 11 is a trace of the charging voltage buildup with respect to time in the conductor of FIG. 9.

The charging voltage buildup V versus time t is shown in FIG. 11. The voltage timer 229 will operate during a time T3 while the charging voltage V is below a value VT. The voltage timer 229 will measure time T3 shown in FIG. 11. The charging voltage buildup is due to an increasing amount of charge going into a capacitance between conductor 212 and adjacent conductors such as conductors 214, 216, 218 and 220. Such a capacitance may be represented as the capacitance of the capacitors of FIG. 10.

The charging voltage level is initially zero volts. The final voltage equals the voltage VDC of voltage source 226. R is the resistance of the series resistor 227 of the tester connected to the switch 28. C1 is the capacitance between conductor 12 and the adjacent conductors 14, 16, 18 and 20 of cable 13. The RC times constant of conductor 12 equals R times C1. As shown in FIG. 11 the RC time constant for conductor 212 is relatively long, since FIG. 10 has four sets of capacitors therein. T3 is equal to R times C1, as shown in FIG. 11, where R is the resistance or the series resistor 227 and C1 is the parallel capacitance of the circuit shown in FIG. 10. T3 is the time during which V increases to $(VDC)(1 - 1/e)$. By determining time T3 one can determining the location of break 10 in conductor 212. The function for the charging voltage buildup V with respect to time is $$V = (VDC)(1 - e^{-t/RC1}).$$

After the time T3 is found, length L3 of conductor 212 can be determined, since T3=R*C3=(R)(K1*L3). K1 is the capacitance per unit length of the conductor 212 with respect to conductors 214, 216, 218 and 220. It is noted that C3=K1*L3.

Figure 12:
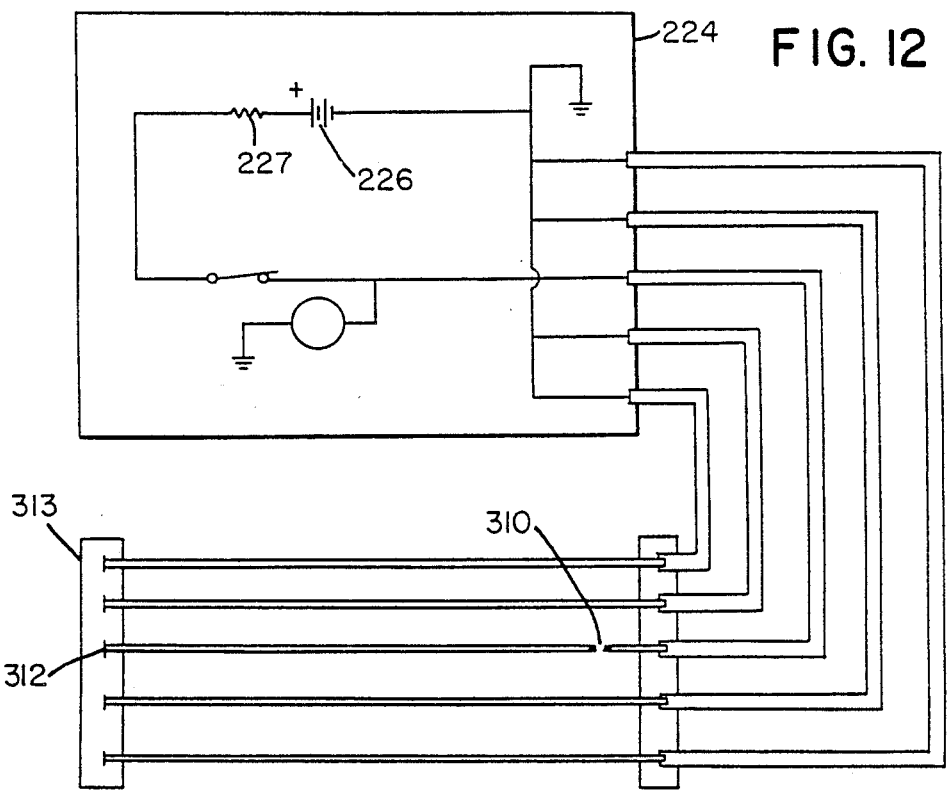
FIG. 12 is a schematic diagram of another test setup for detecting the location of a break in a conductor that is close to an automatic cable tester.

FIG. 12 shows a test set up similar to the test set up of FIG. 9. In FIG. 12 the conductor 312 has a break 310 in its right side, whereas the conductor 212 of FIG. 9 has a break 210 in its left side. Thus the conductor 212 of FIG. 9 is much longer, continuously, than the conductor 312 of FIG. 12. Otherwise the two diagrams of FIG. 9 and FIG. 12 are the same.

Since conductor 212 is longer than conductor 312, the capacitance between conductor 212 and its adjacent conductors is much more than the capacitance between conductor 312 and its adjacent conductors. Therefore the RC time constant of the cable 313 of FIG. 12 is less than the RC time constant of cable 213 of FIG. 9.

Figure 13:
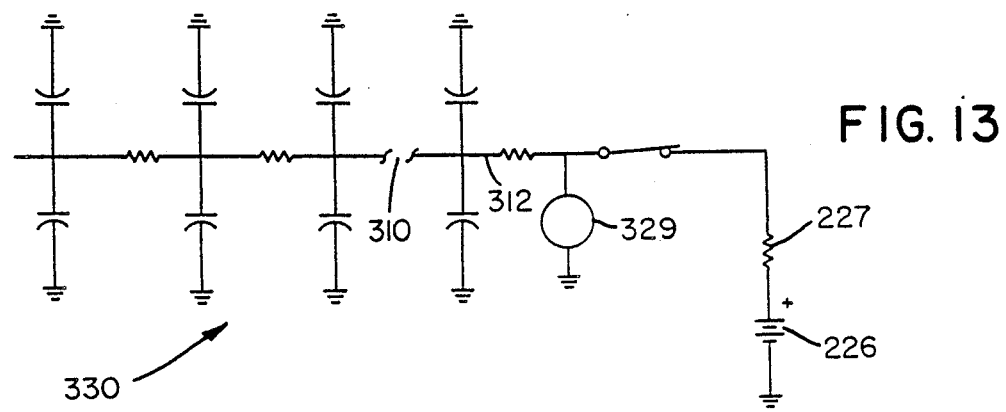
FIG. 13 is a circuit diagram of an electrical circuit for measuring charging voltage buildup with respect to time in the conductor for the test setup of FIG. 12.

FIG. 13 shows a circuit 330 for the test setup of FIG. 12. It is noted that only one set of capacitors is shown in FIG. 13 as being connected to tester 224. Again the RC time constant of the circuit 330 of FIG. 13 is less than the RC time constant T1 of the circuit 230 of FIG. 10, since there is much less capacitance in the circuit 330 of FIG. 13 than there is in the circuit 230 of FIG. 10. The tester portions of FIG. 13 are the same as those of FIG. 10.

Figure 14:
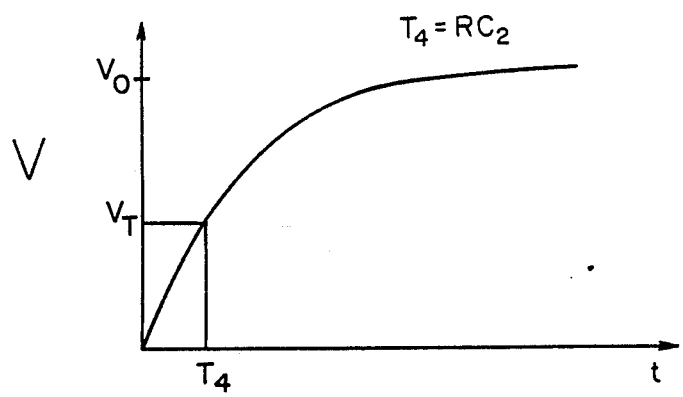
FIG. 14 is a trace of the charging voltage buildup with respect to time in the conductor of FIG. 12.

FIG. 14 shows the buildup of charging voltage V with respect to time t into the cable 313, in the set up of FIG. 12. The cable 313 has less capacitance than the cable 213 of FIG. 9. FIG. 14 shows that the RC time constant RC2 of cable 313 is less than the RC time constant RC1 of cable 213, as shown in FIG. 11. The RC time constant RC2 equals a time T4 during which charging voltage from 0 to (VDC)(1−1/e) in value. VDC is the value of the applied voltage of the voltage source 226. e equals 2.71828 to five significant figures. R is the resistance of the tester resistor 227. C2 is the capacitance between conductor 312 and adjacent conductors in cable 313. By measuring the time T4 that it takes to equal the RC time constant RC2, with the timer 329 of FIG. 13, one can determine the length of the conductor 312, and thus the location of break 310 in conductor 312.

After the time T4 is found, length L4 of conductor 312 can be determined, since T4=R*C4=(R)(K1*L4). K1 is the capacitance per unit length of the conductor 312 with respect to conductors 314, 316, 318 and 320. It is noted that C4=K1*L4.

While the present invention has been disclosed in connection with the preferred embodiment thereof, it should be understood that there may be other embodiments which fall within the spirit and scope of the invention.

What is claimed is:

1. Apparatus for detecting a location of a break in a conductor of a cable having a multiple number of conductors therein comprising:
    (a) means for grounding conductors adjacent to the conductor under test;
    (b) means for sending a charging current into the conductor under test; and
    (c) means for measuring the amount of charging current flow with respect to time into the conductor under test.

2. The apparatus of claim 1 wherein the means for measuring the amount of charging current flow with respect to time comprises a resistor in series with the conductor under test and a recording type cathode ray oscilloscope in parallel circuit with said resistor.

3. The apparatus of claim 1 wherein the means for measuring the amount of charging current flow with respect to time comprises a timer means in series circuit with the conductor under test.

4. A method of determining a location of a break in a conductor of a cable having a multiple number of conductors therein, comprising:
    (a) grounding conductors adjacent to the conductor under test;
    (b) sending a charging current into the conductor under test; and
    (c) determining the RC time constant at which charging current decreases into the conductor under test, with respect to the grounded conductors, said RC time constant being an indication of the location of a break in the conductor under test.

5. Apparatus for detecting a location of a break in a conductor of a cable having a multiple number of conductors therein comprising:
    (a) means for grounding conductors adjacent to the conductor under test;
    (b) means for sending a charging current into the conductor under test; and
    (c) means for measuring the amount of charging voltage buildup with respect to time in the conductor under test.

6. The apparatus of claim 5 wherein the means for measuring the amount of charging voltage buildup with respect to time comprises a voltage measuring device.

7. The apparatus of claim 6 wherein the voltage measuring device is a voltage timer means in series circuit with the conductor under test.

8. A method of determining a location of a break in a conductor of a cable having a multiple number of conductors therein, comprising:
    (a) grounding conductors adjacent to the conductor under test;
    (b) sending a charging current into the conductor under test; and
    (c) determining the RC time constant at which charging voltage buildup increases in the conductor under test, with respect to the grounded conductors, said RC time constant being an indication of the location of a break in the conductor under test.

* * * * *